United States Patent [19]
de Bruyne et al.

[11] 4,426,659
[45] Jan. 17, 1984

[54] HOUSING FOR HIGH-POWER SEMICONDUCTOR COMPONENTS WITH LARGE DIAMETER INTERMEDIATE CONTACT DISKS OF DIFFERING THICKNESSES

[75] Inventors: Patrick de Bruyne, Siggenthal; Andre Jaecklin, Ennetbaden, both of Switzerland; Dieter Eisele, Lampertheim, Fed. Rep. of Germany

[73] Assignee: BBC Brown, Boveri & Company, Limited, Baden, Switzerland

[21] Appl. No.: 252,208

[22] Filed: Apr. 8, 1981

Related U.S. Application Data

[63] Continuation of Ser. No. 46,372, Jun. 7, 1979, abandoned.

[30] Foreign Application Priority Data

Jun. 30, 1978 [CH] Switzerland .................... 7146/78

[51] Int. Cl.³ ............................................. H01L 23/02
[52] U.S. Cl. ......................................... 357/74; 357/79
[58] Field of Search ................................. 357/74, 79

[56] References Cited

U.S. PATENT DOCUMENTS

| 3,995,310 | 11/1976 | Koenig | 357/79 |
| 4,099,201 | 7/1978 | Mueller | 357/79 |
| 4,141,030 | 2/1979 | Eisele et al. | 357/74 |
| 4,162,514 | 7/1979 | de Bruyne et al. | 357/79 |
| 4,274,106 | 6/1981 | Ohdate | 357/74 |

Primary Examiner—Joseph E. Clawson, Jr.
Attorney, Agent, or Firm—Oblon, Fisher, Spivak, McClelland & Maier

[57] ABSTRACT

A housing for high-power semiconductor components is disclosed. The housing consists of an insulator which forms the lateral boundary of the housing, a high-power semiconductor component which is bounded on either side by intermediate disks formed of tungsten or molybdenum, and outer disks formed of copper. The insulator and outer disks are connected by connecting members which may be coated with a protective layer and which surround a protective ring made of a high temperature material such as a ceramic or temperature resistant plastic. The tungsten or molybdenum intermediate disks have a higher total specific energy absorption capacity than does copper.

2 Claims, 2 Drawing Figures

HOUSING FOR HIGH-POWER SEMICONDUCTOR COMPONENTS WITH LARGE DIAMETER INTERMEDIATE CONTACT DISKS OF DIFFERING THICKNESSES This is a continuation of application Ser. No. 046,372, filed June 7, 1979, now abandoned.

BACKGROUND OF THE INVENTION

1. Field of the Invention

The invention relates to a housing for high-power semiconductor components.

2. Description of the Prior Art

Such a housing is known, for example, from DE-OS 2 652 348. It is distinguished by a high resistance to explosion. Whereas in the press-back standard housings usually obtainable commercially only short-circuit currents in the backward direction which lead to an ultimate load integral of $\int i^2 dt \leq 1.5 \cdot 10^6 A^2$ sec are permissible without explosion, values of the ultimate load integral of 5 to $10 \cdot 10^6 A_2$ sec can be achieved with the invention disclosed in the German specification. In the known housing, this is essentially achieved by two techniques.

On the one hand copper rings laterally adjacent to the contacts are provided which prevent an arc, which may develop across a faulty semiconductor in some circumstances, from spreading under the action of its own magnetic field and leading to welding through of the connecting members. On the other hand, in the known housing, the connecting members are provided with a thermal and electrically insulating coating to protect them from the hot arc gases.

SUMMARY OF THE INVENTION

It is an object of the present invention to provide a housing for high-power semiconductor components of the kind already referred to, the explosion resistance of which is greater than that of known semiconductor housings. Preferably, ultimate load integrals with values $\geq 10^7 A^2$ sec should be permissible. In addition, such a housing should be distinguished by a simple and appropriate construction and be able to be produced in an economical manner.

According to the invention, this problem is solved in that those parts which, when an arc is formed, receive the feet of the arc, consist of a material for which the total energy absorption, that is, specific heating and melting energy, is as great as possible, but at least exceeds the value of copper (20 Mega Joule/cm$^3$ at 400° K.), and that the inner walls of the connecting members are additionally secured by a protective layer and/or a protective ring as a protection against released molten products.

On the other hand, the present invention is based on the knowledge that in order to achieve high values of the ultimate load integral, the amount of energy absorbed by the material at the foot of the arc before the molten or gaseous state is reached, is particularly important. For once the material is melted or evaporated, it is flung away by the action of the static and dynamic forces and in an extreme case may lead to the initiation of the unwanted explosion. Since tungsten and molybdenum can absorb considerably higher specific energies before reaching the molten state than copper (c.f. C. Y. Smithells, "Metals Reference Book", 5th Ed. Butterworths 1976), the two first-mentioned metals are more suitable as foot metals than the latter and tungsten is better than molybdenum.

On the other hand, it must be borne in mind that with sufficiently large ultimate load integrals, the development of molten and gaseous products (for example of Si, W, Mo, Cu, Ag etc.) is inevitable. The molten material drips down due to the force of gravity and/or is thrown elsewhere in the housing by the arc plasma. The thin metallic connecting members to the insulator are particularly endangered. These connecting members generally have a relatively low melting point (frequently they are alloys of Ni, Co, Fe and possibly Mn or Cu). Melting through of these connecting members by the molten or gaseous products formed is prevented by the protective rings or a corresponding protective layer.

On the other hand, the protective ring or the protective layer should have a relatively small volume so that the gas volume represents an effective reservoir for the excess pressure. On the other hand, the particular material used should not give off any gas. Preferred materials are high-temperature materials such as glass, quartz or silicon fibers (fabric or pressed form), asbestos, ceramic (preformed or as a hardenable compound) temperature resistant plastic material, etc.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views, and wherein.

DETAILED DESCRIPTION OF THE PREFERRED EMBODIMENTS

Figure 1:
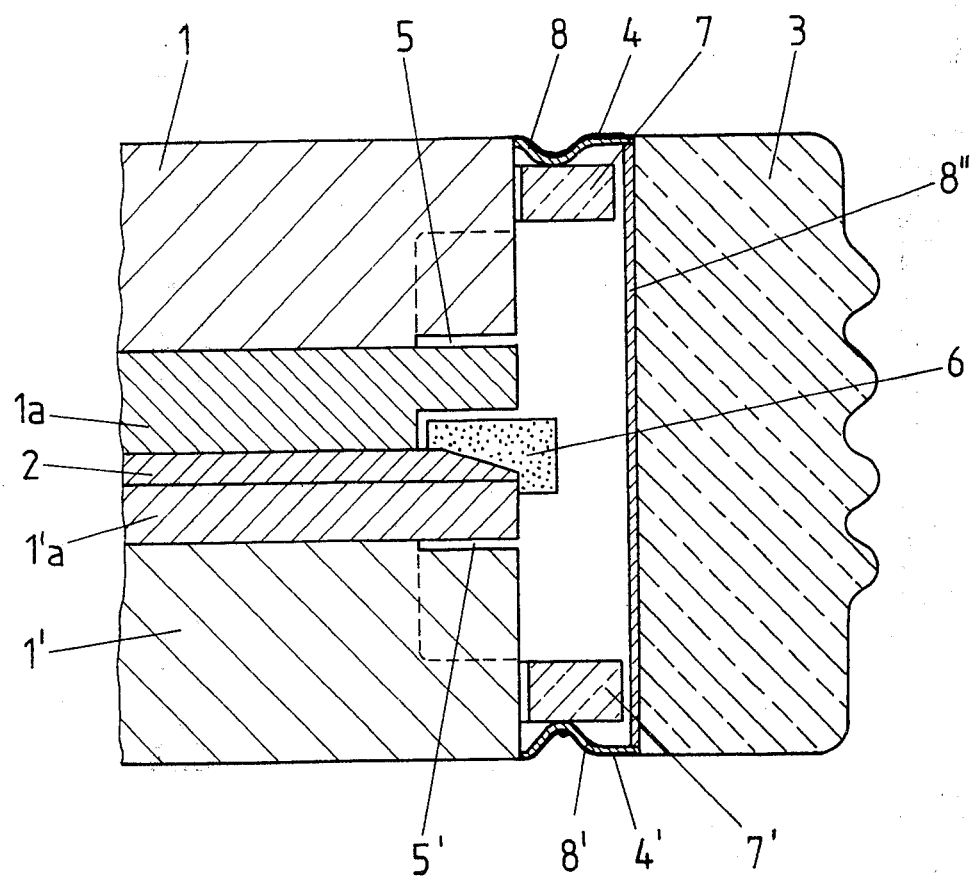
FIG. 1 shows a section through a housing for high-power semiconductor components according to the invention, the contact at the anode side being alloyed to the semiconductor component

In FIG. 1, disposed between the contacts consisting of copper discs 1, 1' and intermediate discs 1a, 1a' is a high-power semiconductor component 2 (diode, thyristor etc.), the marginal region of which is passivated, for example with a multi-layer plastic layer 6. The intermediate discs 1a, 1a' consist of a high energy absorption material, preferably of tungsten or of molybdenum.

The contacts 1, 1', 1a, 1a' and the semiconductor component 2 are surrounded by a ceramic insulator 3 which is connected to the copper discs 1, 1' through flexible connecting members 4, 4'. The connecting members 4, 4' usually consist of sheet metal, or in cheaper types of housing, of plastic material.

The intermediate discs 1a, 1a' are so constructed that they serve as a foot for the arc which may develop across the semiconductor component in certain circumstances. In order to prevent the pressure applied to the semiconductor from being nonhomogeneous, a gap 5, 5' is provided between the copper discs 1, 1' and each of the intermediate discs 1a, 1a'.

This construction is particularly advantageous if the upper and lower intermediate discs 1a, 1a' have the same diameter. Their thickness at the outer edge should be about the same in both discs. Preferably the disc at the cathode side is somewhat thicker because somewhat more energy is released there. From the manufacturing point of view, it may be an advantage to alloy the semiconductor component onto a first thin intermediate disc, for example of molybdenum and then, in order to increase the explosion integral between this molybdenum disc and each copper disc 1, 1', to provide a second intermediate disc 1a, 1a' consisting of tungsten or molybdenum.

The outer diameter of the copper discs 1, 1' should be about the same as that of the intermediate discs 1a, 1a', so as to be able to receive the arc foot in the event of these discs melting through. With an adequate thickness of the intermediate discs, a smaller diameter of the copper discs 1, 1' suffices (broken line in FIG. 1).

In order to prevent the connecting members 4, 4' from being melted through by the molten products, formed, protective rings 7, 7' are provided which may consist of glass, quartz or silicon fibers or of temperature-resistant plastic material, asbestos or ceramic.

In addition to the protective rings 7, 7', the inner walls both of the connecting members 4, 4' and of the insulator 3 may be protected from the temperature shock produced by molten splashes and/or hot gases by a protective layer 8, 8', 8" (c.f. DE-OS No. 2 652 348). Such a protective layer should preferably be applied in close material contact. If the protective ring 7, 7' does not have gastight joints, this protective layer should also be provided beyond the ring. A relatively thin coating (a few 100 um) is sufficient for this protective layer 8, 8', 8", particularly at the metallic connecting members 4, 4', because only very small particles impinge there. This coating also preferably consists of an inorganic high-temperature material which prevents a rapid heating of the parts to be protected by its low heat conductivity. Since a plastic layer is much easier to apply, however, it is an advantage from the production point of view to use plastic layers as the protective layer 8, 8', 8", while accepting a slight formation of gas (for example Kapton foil, silicone rubber, lacquer on a silicone rubber base etc.). In some circumstances one or more layers of such a highly temperature-resistant foil may also replace the protective ring 4, 4'. The layer of gas which develops also causes heat insulation which is very effective locally.

Figure 2:
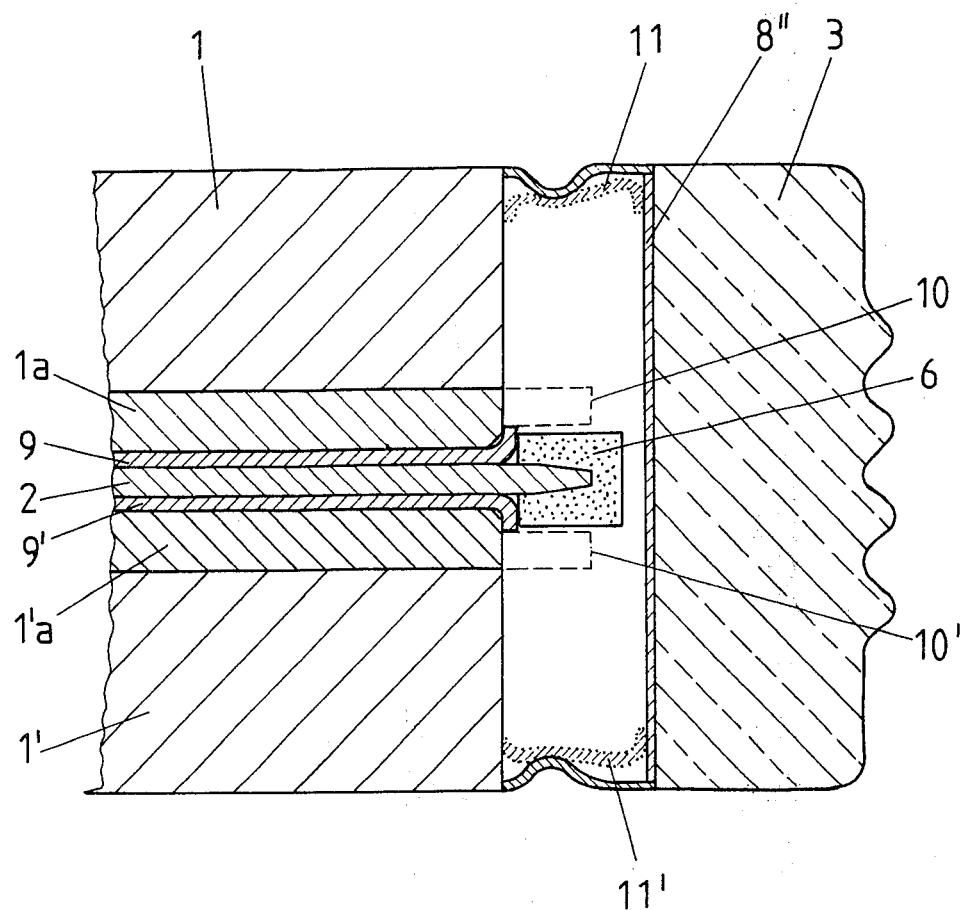
FIG. 2 shows a corresponding housing in which pressure contact is made with the semiconductor component.

In FIG. 2, like parts are provided with the same reference numerals as in FIG. 1. In addition, in FIG. 2, two silver foils 9, 9' are provided between the semiconductor component 2 and the contacts 1a, 1a'. The foot areas 10, 10' which serve to receive the feet of the arcs are drawn forwards as described in the DE-OS No. 2 652,348. The protective ring 4, 4' provided in FIG. 1 is replaced by a plurality of layers 11, 11' of highly temperature-resistant adhesive film.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A housing for high-power semiconductor components subject to the formation of an arc, the housing comprising:
   an insulator forming the lateral boundary of the housing,
   a thyristor disposed within said housing,
   at least two circular multi-part contacts provided on respective sides of said thyristor,
   each multi-part contact consisting of:
   a copper disc, and
   an intermediate disc between said copper disc and said thyristor,
   said intermediate discs being of equal diameter, with the intermediate disc on a cathode side of the thyristor being thicker than on an anode side thereof, and
   at least one of said intermediate discs being in pressure contact with said thyristor,
   both intermediate discs formed of tungsten or molybdenum, and
   a plurality of connecting members which connect said copper discs with said insulator, wherein
   said intermediate discs which serve to receive the feet of the arcs have a larger diameter than the copper discs adjacent to said intermediate discs, and said intermediate discs are separated from the inner wall of said insulator by narrow gaps, the spacing of which is dimensioned so that no loop formation of the arc is effected into said gaps, and wherein
   said connecting members are protected by a protective ring comprising a material selected from the group consisting of glass fibers, quartz fibers, silicon fibers, a temperature-resistant plastic material, asbestos and ceramics, and
   said protective ring is located within said housing, and
   said inner wall of said insulator is provided with a protective layer of high-temperature material.

2. A housing as claimed in claim 1, wherein said intermediate discs which serve to receive the feet of said arcs do not touch said copper discs at their edges, so that a gap with a width $\geq 10$ $\mu$m results therebetween at their edges.

* * * * *